United States Patent
Mueller et al.

(10) Patent No.: US 9,524,766 B2
(45) Date of Patent: Dec. 20, 2016

(54) SYMMETRICAL DIFFERENTIAL SENSING METHOD AND SYSTEM FOR STT MRAM

(71) Applicant: Infineon Technologies AG, Neubiberg (DE)

(72) Inventors: David Mueller, Unterhaching (DE); Wolf Allers, Munich (DE); Mihail Jefremow, Augsburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/714,796

(22) Filed: May 18, 2015

(65) Prior Publication Data

US 2015/0255136 A1     Sep. 10, 2015

Related U.S. Application Data

(62) Division of application No. 13/592,597, filed on Aug. 23, 2012, now Pat. No. 9,076,540.

(51) Int. Cl.
*G11C 11/00* (2006.01)
*G11C 11/16* (2006.01)
(Continued)

(52) U.S. Cl.
CPC ............. *G11C 11/1673* (2013.01); *G11C 7/02* (2013.01); *G11C 7/12* (2013.01); *G11C 29/021* (2013.01);
(Continued)

(58) Field of Classification Search
CPC ...................................................... G11C 11/00
(Continued)

(56) References Cited

U.S. PATENT DOCUMENTS 5,751,635 A * 5/1998 Wong ................. G11C 11/5621
327/93
6,982,909 B2 * 1/2006 Perner .................... G11C 11/14
365/148
(Continued)

FOREIGN PATENT DOCUMENTS

CN        101178927 A     5/2008
DE        19947118 C1     3/2001

OTHER PUBLICATIONS

Notice of Allowance dated May 12, 2014 in connection with U.S. Appl. No. 13/592,404.
(Continued)

*Primary Examiner* — Harry W Byrne
(74) *Attorney, Agent, or Firm* — Eschweiler & Associates, LLC

(57) ABSTRACT

The invention relates to methods and systems for reading a memory cell and in particular, an STT MRAM. In one example, a system for reading a memory cell includes a sense path and an inverse path. A reference current is provided through the sense path and is sampled via a first sampling element in the sense path, and a cell current from the memory cell is provided through the inverse sense path and is sampled via a second sampling element in the inverse sense path. Subsequently, the memory cell is disconnected from the inverse sense path, the cell current is provided through the sense path, the reference source is disconnected from the sense path, and the reference current is provided through the inverse sense path. The output levels are then determined by the cell and reference currents working against the sampled reference and sampled cell currents.

11 Claims, 5 Drawing Sheets

(51) Int. Cl.
*G11C 7/02* (2006.01)
*G11C 7/12* (2006.01)
*G11C 29/02* (2006.01)
*G11C 29/50* (2006.01)

(52) U.S. Cl.
CPC .............. *G11C 29/028* (2013.01); *G11C 11/16* (2013.01); *G11C 2029/5006* (2013.01)

(58) Field of Classification Search
USPC ..... 365/80, 83, 85, 148, 158, 163, 171, 173; 257/421, E21.665; 438/3; 977/933–935
See application file for complete search history.

(56) References Cited

U.S. PATENT DOCUMENTS

| | | | |
|---|---|---|---|
| 7,088,626 B2 | 8/2006 | Mori et al. | |
| 7,974,132 B2* | 7/2011 | Cornwell | G11C 11/5642 365/185.03 |
| 2005/0007816 A1* | 1/2005 | Smith | G11C 11/15 365/171 |
| 2005/0007830 A1* | 1/2005 | Perner | G11C 11/14 365/189.07 |
| 2006/0039191 A1* | 2/2006 | Perner | G11C 11/14 365/158 |
| 2010/0020604 A1 | 1/2010 | Cornwell et al. | |
| 2011/0080763 A1 | 4/2011 | Siau et al. | |
| 2011/0122679 A1 | 5/2011 | Chen et al. | |
| 2011/0286271 A1* | 11/2011 | Chen | G11C 7/1006 365/185.09 |
| 2014/0056058 A1 | 2/2014 | Jefremow | |
| 2014/0056059 A1 | 2/2014 | Mueller | |

OTHER PUBLICATIONS

Notice of Allowance dated Mar. 3, 2015 in connection with U.S. Appl. No. 13/592,597.
Office Action dated Nov. 22, 2013 in connection with U.S. Appl. No. 13/592,404.

* cited by examiner

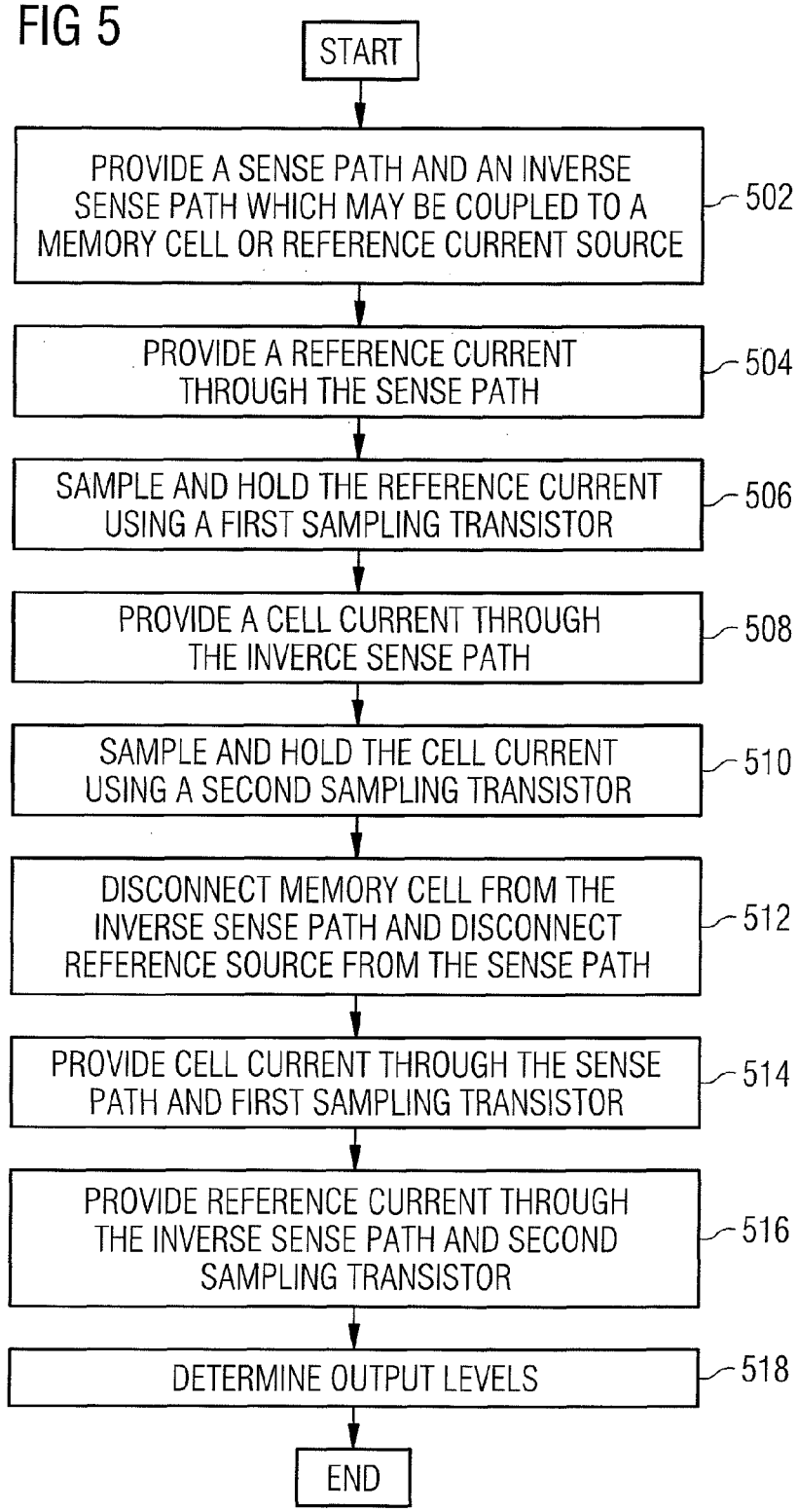

SYMMETRICAL DIFFERENTIAL SENSING METHOD AND SYSTEM FOR STT MRAM

CROSS REFERENCE TO RELATED APPLICATIONS

This application is a divisional patent application claiming priority to U.S. patent application Ser. No. 13/592,597 filed on Aug. 23, 2012 entitled "Symmetrical Differential Sensing Method and System for STT MRAM" and is hereby incorporated in its entirety.

FIELD

The invention relates to methods and systems for sense amplifiers for memory cells. More specifically, the invention relates to methods and systems for improving the reading capabilities of sense amplifiers for memory cells, for example, for sense amplifiers for Spin Torque Transfer Magnetic Random Access Memory (STT MRAM) cells.

BACKGROUND

Magnetoresistive random access memory (MRAM) is a non-volatile random access memory in which data is stored by magnetic storage elements.

A conventional MRAM cell comprises two ferromagnetic plates separated by a thin insulating layer. One of the two plates is a permanent magnet ("fixed layer") set to a particular polarity while the field of the second plate ("free layer") can be configured to match that of an external field to store data. This configuration is known as a spin valve and is the simplest structure for an MRAM bit. Such magnetic memory cells may be combined to form a memory device.

Sensing or reading of a magnetic memory cell is accomplished by measuring the electrical resistance of the cell. A particular cell is typically selected by powering an associated transistor that switches current from a bitline through the cell to ground. The electrical resistance of the cell changes due to the spin orientation of the electrons in the two plates of the STT MRAM cell. By measuring the resulting current, the resistance inside any particular cell can be determined. In general, the cell is considered to be a "1" if the two plates have the same polarity and a "0" if the two plates are of opposite polarity and have a higher resistance.

Referring now to FIG. 1, there is a shown an exemplary schematic diagram of a conventional system 10 for sensing a magnetic memory cell 12 such as a Spin Transfer Torque Magnetoresistive Random Access Memory (STT MRAM) cell. The prior art system 10 comprises a plurality of transistors, 14, 16, 18 and 20, a reference current source 22 for providing a reference current 24, a cell current 26 from the memory cell 12, a bitline (BL) control voltage 28, a cell output node 30, a reference output 32 and a mirrored reference current 34. The transistors 14 and 16 may be PMOS transistors, while the remaining transistors 18 and 20 may be NMOS transistors.

In operation, the two pairs of transistors of the prior art sensing system 10 adjust and sense the cell current 26 and the reference current 24 and convert this current difference into a voltage difference between the output nodes 30 and 32. The first pair of transistors 14 and 16 acts as a current mirror while transistors 18 and 20 act as clamp devices for bitline voltage regulation, which may be adjusted by the BL control voltage 28. After the BL control voltage 28 is set, transistors 18 and 20 charge the reference bitline 36 and the cell bitline 38 to a fixed potential which is typically about one threshold voltage of NMOS transistor below BL control voltage 28. The diode connected PMOS transistor 16, which is part of the current mirror senses the reference current 24 which flows through the NMOS transistor 20. The reference current source 22 is conventionally implemented by an NMOS transistor with accurately controlled gate voltage or by so called reference cells such as preconditioned STT MRAM cells. The reference current 24 is usually set between the current which corresponds to a high current STT MRAM cell state and the current corresponding to a low current STT MRAM cell state. This reference current 24 is mirrored simultaneously by the PMOS current mirror 14, 16 to the cell out node 30. The cell current 26 flows through the NMOS transistor 18 to the cell out node 30. If the cell current 26 is higher than the reference current 24, then the cell out voltage 30 is driven to ground. If the cell current 26 is lower than the reference current 24, then the cell out voltage 30 goes up to VDD. The voltage at the reference out node 32 remains fixed at about one threshold voltage of the PMOS transistor 16 below VDD due to the diode connected PMOS 16. The voltage difference between the cell out node 30 and the reference out node 32 is compared and amplified by a subsequent differential latch circuit (not shown) to a full CMOS level.

Two of the main problems with the prior art sensing system 10 are the accuracy of the mirrored reference current, Iref mir 34, and the difference between the bitline voltage 38 and the reference bitline voltage 36 if the difference of the cell currents between a high current cell state and low current cell state of the STT MRAM cell, also known as the read window, is small. These two effects diminish the accuracy of the sense amplifier by resulting in two limiting factors for the read window: the current mirror in the sense amplifier and the devices controlling the bit line voltage which are necessary for the STT MRAM memory cell.

The mismatch of the threshold voltage Vtp of the PMOS transistors 14, 16 in the current mirror leads to a mismatch of the mirrored reference current Iref mir 34 and the reference current Iref 24. The mismatch of the threshold voltages Vtn of the NMOS transistors 18, 20 results in different voltages across the selected STT-MRAM cell 12 and the reference current source 22, which may also be a preconditioned STT-MRAM cell. This voltage difference leads to a current difference between the reference current 24 and the cell current 26 for the same resistances for both paths since the current of an STT MRAM cell is directly proportional to a voltage across it.

Therefore, there exists a need for a system and a method for sensing a magnetic memory cell, such as an STT MRAM, which does not have these disadvantages. More specifically, there is a need for a system and method for sensing an STT MRAM cell that eliminates the error introduced by the current mirror mismatch, improves sensitivity to small read windows, and improves robustness against power supply noise.

SUMMARY

In accordance with one aspect of the invention, there is provided a system for sensing or reading a memory cell, such as an STT MRAM, comprising a sense path and an inverse sense path, both of which may be coupled to either a reference source or a memory cell. The reference source is first coupled to the sense path and the reference current flows through the sense path while the memory cell is coupled to the inverse sense path with the cell current flowing through the inverse sense path. The memory cell is then switched from the inverse sense path to the sense path, and the reference source is switched from the sense path to the inverse sense path.

In one embodiment, the sense path may comprise a first sampling element for sampling and holding the reference current, and the inverse sense path may comprise a second sampling element for sampling and holding the cell current. When the reference source is connected to the sense path, the reference current is sampled by the voltage across the first sampling element on a capacitance. When the cell current is connected to the inverse sense path, the cell current is sampled by the voltage across the second sampling element on a capacitance. The memory cell is then disconnected from the inverse sense path and coupled to the sense path to provide a cell current through the sense path while the reference source is disconnected from the sense path and coupled to the inverse sense path to provide the reference current through the inverse sense path. The output levels of the sensing system are determined by the cell and reference currents working against the sampled reference current and the sampled cell current.

In accordance with a further aspect of the invention, there is provided a method for reading or sensing a memory cell, such as an STT MRAM. In one embodiment, the method comprises providing a first sampling element for sampling a reference current and a second sampling element for sampling a cell current, and then switching the cell current to flow through the first sampling element and switching the reference current to flow through the second sampling element. The reference current is sampled using the voltage across the gate of the first sampling element on a capacitance, and the cell current is sampled using the voltage across the gate of the second sampling element on a capacitance. The output levels are then determined by the cell current and reference current working against the sampled reference current and the sampled cell current, respectively.

In another embodiment, the method comprises providing a sense path and an inverse sense path which may be coupled to either a memory cell or a reference source, providing a reference current through the sense path and providing a cell current through the inverse sense path, disconnecting the memory cell from the inverse sense path, disconnecting the reference source from the sense path, providing the cell current from the memory cell through the sense path, and providing the reference current through the inverse sense path.

In one embodiment, the sense path comprises a first sampling element, and the inverse sense path comprises a second sampling element. Initially, the reference current is sampled by the voltage across the gate of the first sampling element on a capacitance as it flows through the sense path and the cell current is sampled by the voltage across the gate of the second sampling element on a capacitance. After the reference and cell currents have been sampled, the first sampling element is then used to measure the cell current from the memory cell, and the second sampling element is used to measure the reference current. The output levels of the sensing system are determined by the cell current and reference current working against the sampled reference current and the sampled cell current, respectively.

Further features, aspects and advantages of the present invention will become apparent from the following detailed description of the invention made with reference to the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated as they become better understood by reference to the following detailed description.

FIG. 5 is a flowchart illustrating a method for sensing a magnetic memory call in accordance with one embodiment of the present invention.

DETAILED DESCRIPTION

In the following detailed description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. Therefore, the following detailed description is not to be taken in a limiting sense, and the scope of the present invention is defined by the appended claims.

Figure 1:
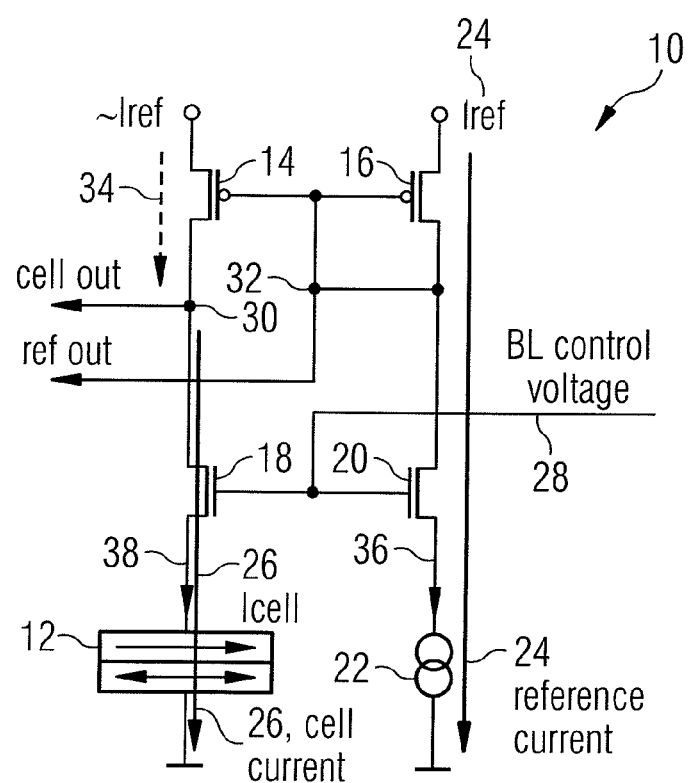
FIG. 1 is a schematic diagram of a conventional embodiment of a magnetic memory cell and a sense amplifier.
Figure 2:
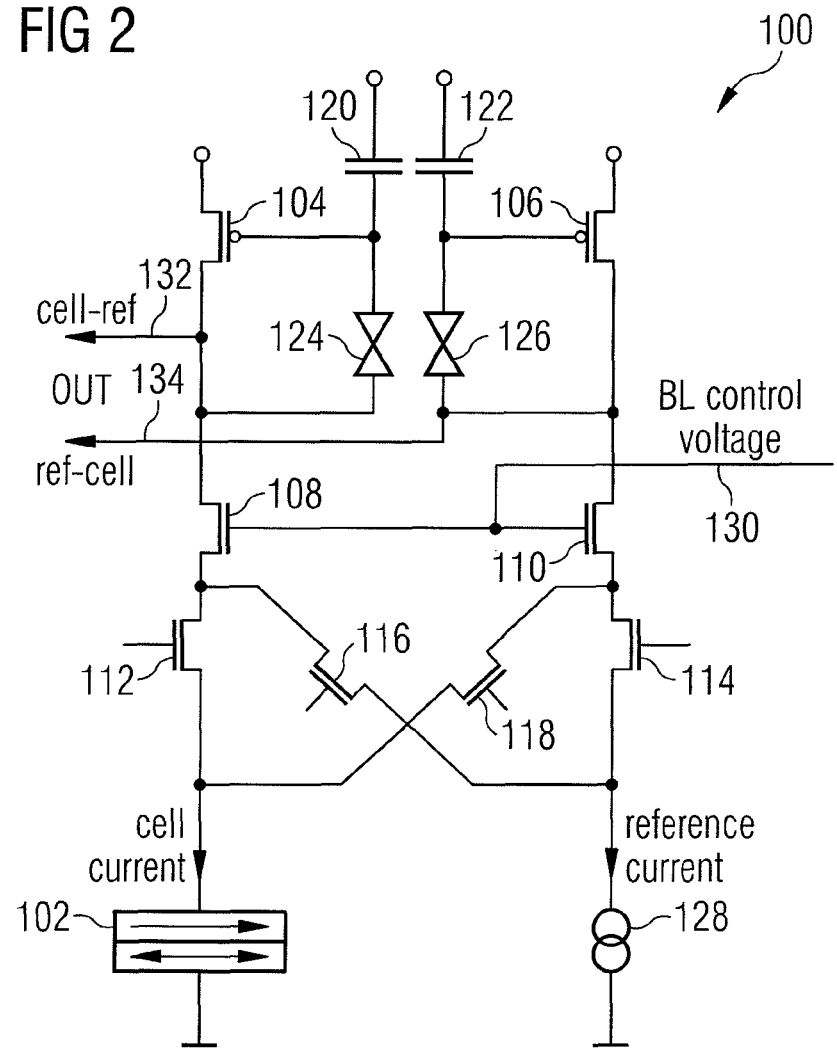
FIG. 2 is an example schematic diagram of a sensing system for a magnetic memory cell in accordance with one embodiment of the present invention.

FIG. 2 is an example schematic diagram of a system 100 for sensing or reading a magnetic memory cell in accordance with one embodiment of the present invention. The system 100 comprises a magnetic memory cell 102 such as Spin Transfer Torque Magnetoresistive Random Access Memory (STT MRAM) cell which is to be sensed or read by the system 100. The system 100 further includes a plurality of transistors, 104, 106, 108, 110, 112, 114, 116 and 118, a first and second capacitance 120 and 122, a first and second switch 124 and 126, a reference current source 128, a bit line control voltage 130, a cell output 132, and a reference output 134.

The transistors 104 and 106 may be PMOS transistors, while the remaining transistors 108, 110, 112, 114, 116 and 118 may be NMOS transistors. Transistors 104 and 106 are also referred to as "sampling transistors" or "sampling elements" because in accordance with one embodiment of the present invention, the first sampling element 104 samples and holds the reference current, and the second sampling element 106 samples and holds the cell current. One skilled in the art will realize that the sampling element 104 is not limited to a transistor but may comprise any sampling element or combination of elements that samples and holds the reference current. One skilled in the art will also realize that the present invention is not limited to the sensing or reading of a single memory cell, but that the invention may be used to read an array of magnetic memory cells and that the following description referring to one memory cell is for the purpose of simplification only.

The system 100 of the present invention overcomes the problems of the prior art by eliminating the current mirror. In one embodiment of the present invention, the reference current and the cell current are fed through the same transistors 104 and 108, and 106 and 110, consecutively. In other words, first the reference current is fed through transistors 104 and 108, and the current from the memory cell, i.e. the cell current, is fed through transistors 106 and 110. Subsequently, the cell current is fed through transistors 108 and 104, and the reference current is fed through transistors 106 and 110. This two step approach will be described below in more detail with respect to FIGS. 3 to 5.

This two step approach for reading the memory cell through the same transistors advantageously avoids any mismatch effect between the bit line control devices and the mirror transistors. Additionally, the symmetrical structure of the system 100 advantageously provides an almost ideal power-supply noise rejection and reduced coupling (symmetrical) on the bit line control voltage. Moreover, because both differential output ports are high-ohmic, the differential signal swing is doubled.

Figure 3:
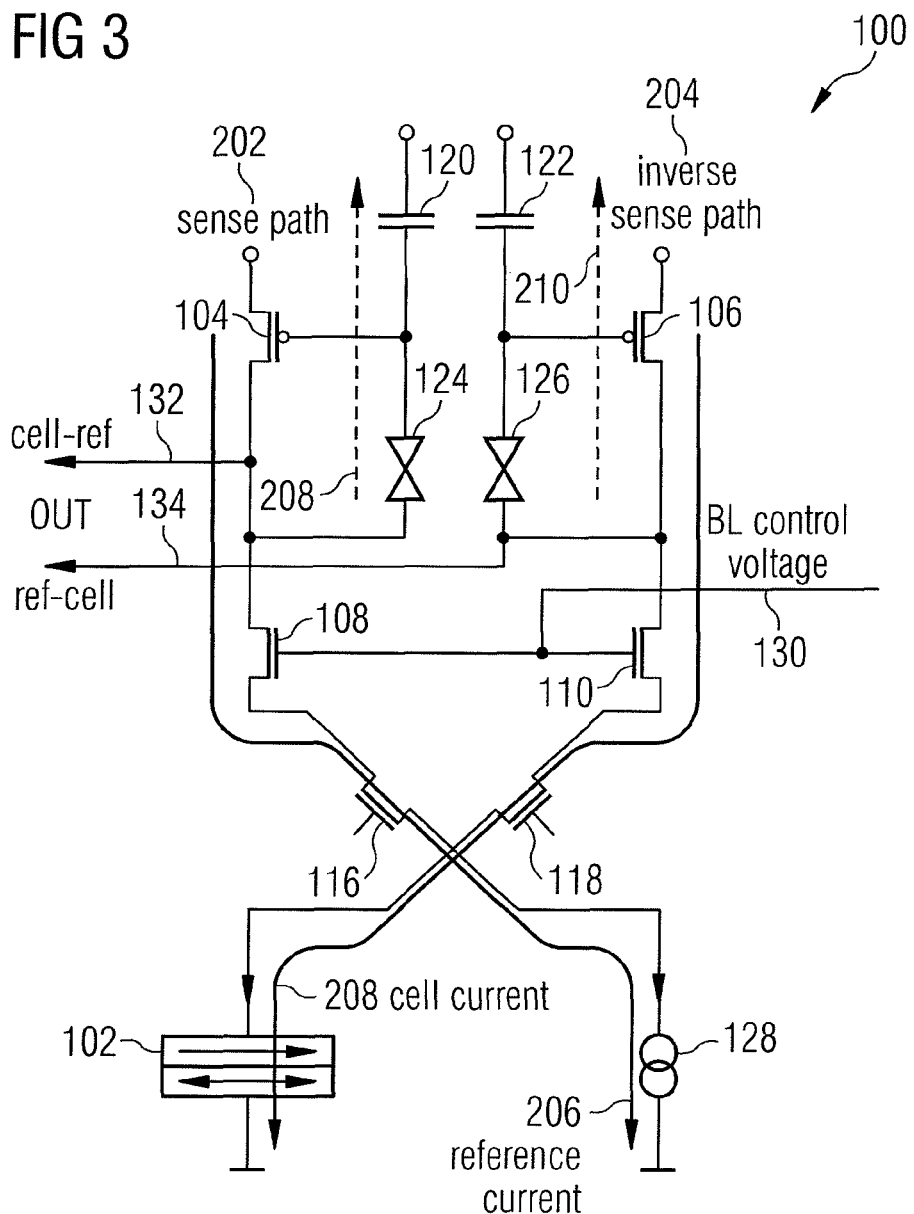
FIG. 3 is an example schematic diagram of a sensing system for a magnetic memory cell in accordance with one embodiment of the present invention.

FIG. 3 is an example schematic diagram of a system 100 for sensing or reading a magnetic memory cell in accordance with one embodiment of the present invention. FIG. 3 illustrates two paths of the system 100, the sense path 202 and the inverse sense path 204. In accordance with one embodiment of the operation of the system 100, the reference source 128 is connected to the sense path 202 of system 100. This may be accomplished by setting an appropriate bit line control voltage 130 and enabling the transistor 116. The reference current flows through the sense path 202, through transistor 108 and 104, wherein transistor 104 is preferably implemented in diode configuration since during this phase, the digital switch 124 is on, and the reference current 206 is sampled by the gate-to-source voltage of the sampling transistor 104 on a capacitance 120 as illustrated by dashed line 208.

At substantially the same time, the memory cell 102 is connected to the inverse sense path 204 of the system 100. This may be accomplished by setting an appropriate bit line control voltage 130 and enabling the transistor 118. The cell current flows through the inverse sense path 204, through transistor 106 and 110, wherein transistor 106 is, in one embodiment, a diode connected MOS transistor since during this phase, the digital switch 126 is on, and the cell current 208 is sampled by the gate-to-source voltage of the sampling transistor 106 on a capacitance 122 as illustrated by dashed line 210. Connecting the memory cell 102 to the inverse sense path 204 enables the cell current 208 to be sampled by sampling transistor 106 and also enables precharging of the memory cell 102 before being read. One skilled in the art will realize that passing the reference current 206 through the sense path 202 and passing the cell current 208 through the inverse sense path 204 may not occur at exactly the same time but that it is advantageous in one embodiment of the present invention to perform these two steps at substantially the same time so as to have as minimal an impact on the total read time of the memory cell 102.

Figure 4:
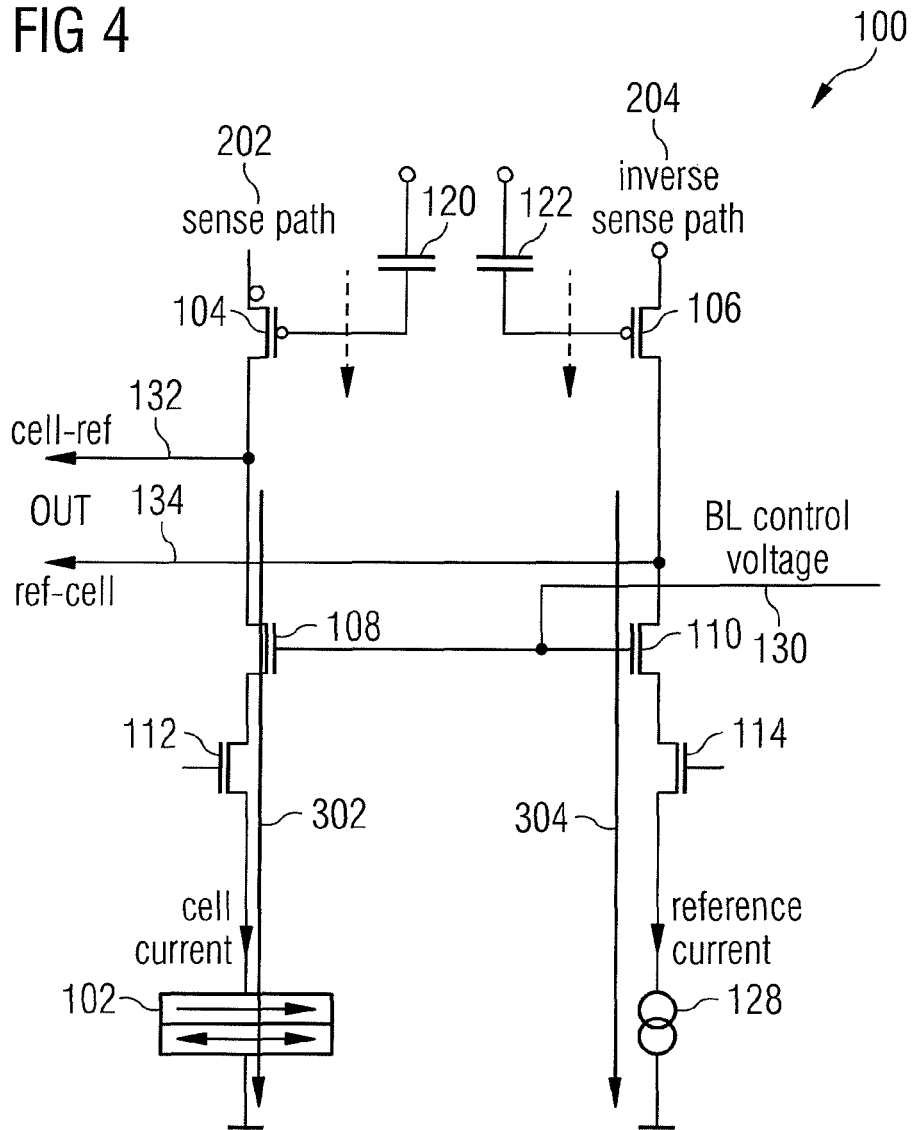
FIG. 4 is an example schematic diagram of a sensing system for a magnetic memory cell in accordance with one embodiment of the present invention.

FIG. 4 is an example schematic diagram of a system 100 for sensing a magnetic memory cell in accordance with one embodiment of the present invention. After the reference current 206 has been passed through the sense path 202 and the cell current 208 has been passed through the inverse sense path 204, as described above with reference to FIG. 3, the memory cell 102 is switched from the inverse sense path 204 to the sense path 202, as illustrated by the cell current line 302. This may be done by setting an appropriate bit line control voltage 130 and enabling the transistor 112. The reference source 128 is switched from the sense path 202 to the inverse sense path 204, as illustrated by current line 304, by setting an appropriate bit line control voltage 130 and enabling the transistor 114. At substantially the same time, the capacitances 120 and 122 are disconnected from the cell-reference out node 132 and the reference-cell out node 134 respectively via the switches 124 and 126 opening, respectively.

As a result, the first sampling element 104 now draws the previously stored reference current against the connected cell current 302, and the second sampling element 106 draws the previously stored cell current against the connected reference current 304. The output of the sensing system 100 is then determined by the cell (or reference) current working against the sampled reference (or cell) current, i.e. active load of sampling elements 104 and 106. The output levels are now both carrying the difference signal with opposite sign. Thus, the present invention adjusts the sampling elements 104 and 106 to match the reference source 128 and the memory cell 102 respectively. As a result, the present invention advantageously avoids any mismatch effect between the bit line control devices and the mirror transistors.

FIG. 5 is a flowchart illustrating an example sensing method for reading a memory cell, such as an STT MRAM, in accordance with one embodiment of the present invention. For clarity, the method 500 for sensing a magnetic memory cell is described in context of the system 100 described in FIGS. 2 through 4. However, in alternate embodiments, other configurations may be used. Moreover, other embodiments may perform the acts described here in different orders and/or other embodiments may perform additional and/or different steps than those described here.

A sense path and an inverse sense path, both of which may be connected to either a reference current source or a memory cell, are provided at 502. The sense path comprises at least a first sampling element 104 and a bit line control transistor 108, and the inverse sense path comprises at least a second sampling element 106 and a bit line control transistor 110. A reference current from the reference source is provided through the sense path at 504, and the first sampling element 104 samples and holds the reference current at 506. At substantially the same time as 504 and 506, a cell current from the memory cell is provided through the inverse sense path at 508, and the second sampling element 106 samples and holds the cell current at 510.

The memory cell is then disconnected from the inverse sense path and the reference source is disconnected from the sense path at 512. The memory cell is then connected to the sense path and the memory cell current is provided through the sense path and through the first sampling element 104 at 514. The reference source 128 is connected to the inverse sense path and the reference current is provided through the inverse sense path and through the second sampling element 106 at 516. The output levels of the sensing system 100 are then determined at 518.

One skilled in the art will realize that the present invention is not limited to sensing STT MRAM cells as described above but that the present invention may also be used for other memories that employ a current sensing scheme and have a small read window. For example, the present invention may also be used with multilevel cells, phase change RAM (PCRAM), conductive bridging RAM (CBRAM), etc. . . . . The advantage of the present invention is the elimination of the error introduced by the current mirror mismatch and mismatch in bitline and reference line voltage.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for reading a memory cell, comprising:
providing a first sampling element for sampling a reference current in a sense path;
providing a second sampling element for sampling a cell current from the memory cell;
measuring the cell current from the memory cell using the first sampling element; and
measuring the reference current using the second sampling element.

2. The method of claim 1, further comprising of providing a reference source which provides the reference current through the first sampling element.

3. The method of claim 1, wherein the first sampling element comprises a diode connected MOS transistor.

4. The method of claim 1, wherein the second sampling element comprises a diode connected MOS transistor.

5. The method of claim 1, wherein the reference current is sampled by a voltage across at least a portion of the first sampling element on a first capacitance, and the cell current is sampled by a voltage across at least a portion of the second sampling element on a second capacitance.

6. The method of claim 1, further comprising providing an inverse sense path for the memory cell when sampling the cell current, wherein the inverse sense path for the memory cell is a different path than the sense path.

7. The method of claim 6, wherein providing the inverse sense path through the second sampling element for the cell current occurs around the same time as providing the sense path through the first sampling element for the reference current.

8. The method of claim 7, further comprising switching the memory cell from the inverse sense path to the sense path through the first sampling element after sampling the cell reference current and the cell current.

9. The method of claim 8, wherein the reference current is sampled by a voltage across at least a portion of the first sampling element on a first capacitance, and the cell current is sampled by a voltage across at least a portion of the second sampling element on a second capacitance, and further comprising disconnecting the first capacitance and the second capacitance from the first sampling element and the second sampling element, respectively.

10. The method of claim 8, wherein a first node associated with the first sampling element comprises a first output and a second node associated with the second sampling element comprises a second output, and wherein the first and second outputs of the sensing system both carry the difference signal with opposite sign.

11. The method of claim 1, wherein the memory cell comprises an STT MRAM.

* * * * *